(12) United States Patent
Divakaruni et al.

(10) Patent No.: US 6,420,749 B1
(45) Date of Patent: Jul. 16, 2002

(54) TRENCH FIELD SHIELD IN TRENCH ISOLATION

(75) Inventors: Ramachandra Divakaruni, Somers, NY (US); Jeffrey P. Gambino, Westford, VT (US); Edward W. Kiewra, Verbank, NY (US); Jack A. Mandelman, Stormville, NY (US); Carl Radens, Lagrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 09/602,427

(22) Filed: Jun. 23, 2000

(51) Int. Cl.$^7$ ............................................. H01L 27/108
(52) U.S. Cl. ...................... 257/301; 257/308; 257/510; 438/424; 438/440
(58) Field of Search ................. 438/424, 440; 257/301, 308, 516, 510

(56) References Cited

U.S. PATENT DOCUMENTS

| | | | |
|---|---|---|---|
| 5,436,488 A | | 7/1995 | Poon et al. |
| 5,512,767 A | | 4/1996 | Noble, Jr. |
| 5,557,135 A | | 9/1996 | Hashimoto |
| 5,661,320 A | * | 8/1997 | Morita ........................ 257/296 |
| 5,701,022 A | * | 12/1997 | Kellner et al. ............... 257/300 |
| 5,723,889 A | * | 3/1998 | Choi et al. ................... 257/329 |
| 5,854,500 A | * | 12/1998 | Krautschneider ........... 257/300 |
| 5,861,649 A | * | 1/1999 | Yoshida et al. .............. 257/301 |
| 5,869,376 A | | 2/1999 | Tomioka |
| 5,909,044 A | * | 6/1999 | Chakravarti et al. ......... 257/301 |
| 5,939,746 A | * | 8/1999 | Koyama et al. ............. 257/306 |
| 6,294,473 B1 | * | 9/2001 | Oliver ......................... 438/705 |

FOREIGN PATENT DOCUMENTS

| | | | | | |
|---|---|---|---|---|---|
| EP | 1 026 745 A2 | * | 9/2000 | ......... | H01L/27/108 |
| JP | 11 284146 | * | 10/1999 | ......... | H01L/27/108 |

* cited by examiner

Primary Examiner—Olik Chaudhuri
Assistant Examiner—David S. Blum
(74) Attorney, Agent, or Firm—McGinn & Gibb, PLLC; Ira D. Blecker, Esq.

(57) ABSTRACT

A method and structure for a semiconductor device which includes a substrate comprising trenches, a plurality of devices on the substrate isolated by the trenches, conductive sidewall spacers within the trenches, and an insulator filling the trenches between the conductive sidewall spacers. A first conductive sidewall spacer is electrically connected to a first device of said plurality of devices and a second conductive sidewall spacer is electrically connected to a second device of the plurality of devices. The first device can be biased independently of the second device. A contact extends above a surface of the substrate. A first contact abuts a first device and a first conductive sidewall spacer. An insulator separates the conductive sidewall spacers. A first contact may be equidistant between the first conductor and the second conductor. The conductive sidewall spacers comprise field shields.

13 Claims, 4 Drawing Sheets

TRENCH FIELD SHIELD IN TRENCH ISOLATION

BACKGROUND OF THE INVENTION

1. Field of the Invention

The present invention generally relates to field shield in shallow trench isolation and independent isolation biasing of actively isolated devices on a semiconductor chip.

2. Description of the Related Art

Conventional electronic and computer systems utilize silicon wafers with a complex arrangement of devices such as capacitors, resistors and transistors for microprocessing. The devices are located on the surface of the silicon wafer, which is itself a conductor. Thus, it is necessary to isolate areas of the wafer to prevent undesired parasitic currents among neighboring devices.

The isolation is typically accomplished using a technique called shallow trench isolation (STI). STI involves identifying an area of the substrate 10 (e.g., silicon) in which no current is desired. Then, a hole or shallow trench 13 is created, as shown in FIG. 1a. Next, as shown in FIG. 1b, the trench is filled with an STI liner 1 and an insulator STI fill (e.g. oxide) 2. The surface of the substrate 10 is planarized as shown in FIG. 1c. Devices (e.g., transistors) 15 are formed on the substrate 10. As shown in FIG. 1d, each device 15 has a device gate 3, a device gate sidewall dielectric 4, and a device source/drain diffusion 5.

STI isolates adjacent devices but it does not permit the electrical behavior independent tailoring of current-voltage characteristics of individual devices.

STI, as practiced by the present art, does not provide electrical control elements within isolation regions which may be used for selective tailoring of the electrical behavior of individual MOSFETs. To provide optimal performance in typical CMOS applications unique values of threshold voltage (Vt) are desirable for specific devices. For example, in DRAM applications relatively low threshold voltages (e.g., 0.4 V) are desired for certain high-performance MOSFETs (e.g., sense amplifiers, wordline drivers) which support (are connected to) the actual memory array. However, in the memory array itself MOSFETs with relatively high threshold voltages are needed to avoid excessively large sub-Vt leakage. Large sub-Vt leakage current degrades data retention time of the storage capacitors in the array.

Additionally, due to manufacturing tolerances threshold voltages may vary across each chip or across a wafer. This variation may be somewhat predictable because of known spatial variation patterns of processing tools (i.e. implantation, etching, deposition). It is desirable to minimize this spatial variation in threshold voltage.

As a result of this need to selectively tailor individual threshold voltages, techniques such as selective ion implantation of dopant impurities and/or selective gate oxide thicknesses are employed. These conventional means of tailoring threshold voltages are costly, since they require additional masks and/or processing complexity.

Therefore, there is a need for providing a type of isolation among neighboring MOSFETs which may be used to selectively tailor the threshold voltage of adjacent MOSFETs by use of an imbedded electrical control element.

Another problem that exists in STI is gap fill. Normally, an oxide is placed in the STI region, but gaps which are problematic to the semiconductor function may occur in the oxide.

Therefore, there is a need for an improved isolation that permits independent control of the active devices on the silicon wafer and reduces the gap fill problem.

SUMMARY OF THE INVENTION

It is, therefore, an object of the present invention to provide a structure and method for a semiconductor device which includes a substrate comprising trenches, a plurality of devices on the substrate isolated by the trenches, conductive sidewall spacers within the trenches, and an insulator filling the trenches between the conductive sidewall spacers.

The invention also includes a contact above a surface of the substrate that is electrically connected to one of the conductive sidewall spacers and a voltage source electrically connected to the contact. The source can independently bias a one of the plurality of devices. The source can also bias a subset of the plurality of devices.

Also, the invention can include a first contact electrically connected to a first sidewall spacer and a second contact electrically connected to a second sidewall spacer. One of the plurality of devices may be independently biased by applying different voltages to the first conductive sidewall spacer and second conductive sidewall spacer.

Also, an insulator separates the conductive sidewall spacers. The first conductor and the second conductor can be field shields and can be beneath a top surface of the substrate.

A first contact may be equidistant between the first conductor and the second conductor.

The invention also comprises a method of making a semiconductor device which includes forming a plurality of trenches in a substrate, forming a plurality of devices on a substrate, forming an insulating layer on the surface of the trenches, filling the trenches with a conductor, and etching the conductor from the trench to form conductive side wall spacers. Each of the sidewall spacers is individually capacitively coupled to an adjacent device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As discussed above, STI is used to isolate areas of a silicon wafer and avoid parasitic currents among active devices on the wafer. In this manner, STI functions passively. A trench of nonconductive material is placed between the areas of the wafer that need to be isolated. On the other hand, this invention uses a shallow trench for active isolation of the active devices on the silicon wafer.

Figure 8A:
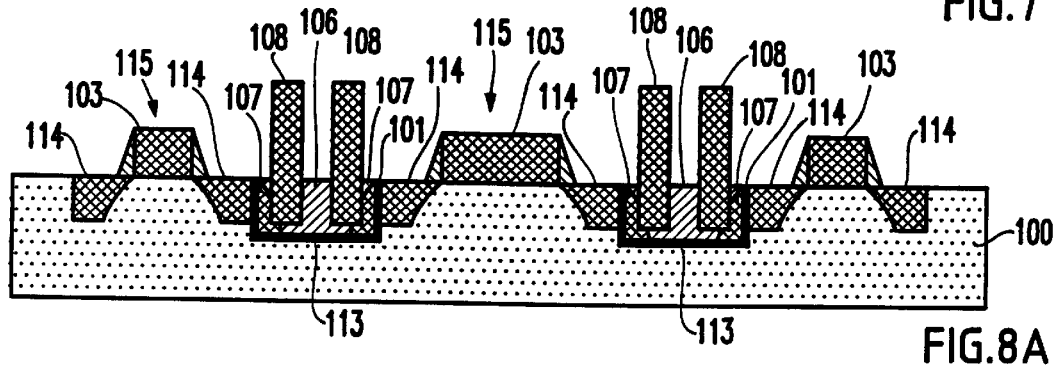
FIGS. 8a–8d are schematic diagrams depicting variations of contact field shield structure; and, FIGS. 9a and 9b are top views of the independent biasing of the invention.

As depicted in FIG. 8a, the final structure of the invention comprises a substrate 100 (e.g., silicon) which contains trenches 113. Each trench 113 is lined with an insulating STI liner 101. Field shields 107 (e.g., conductive sidewall spacers) are located against each side wall of the trench 113 and are separated by an insulator STI fill (e.g., oxide) 116.

The field shields 107 provide various benefits over the prior art and specifically over conventional passive STI. First, unlike passive STI, the invention allows independent voltage control in areas of the substrate which produces several advantages. The devices on the surface of the substrate may receive different voltages and thus may be independently biased for individual control of threshold voltage. The lack of the field shield 107 in passive STI did not permit this selective control of threshold voltage.

The independent biasing also reduces the sub-Vt leakage of the devices which are required to retain data on storage capacitors. In addition, the field shield 107 may bias the devices 115 independently of the well doping. The field shields also allow of parasitic currents control without high doping. In addition, the field shields 107 may be used as a local interconnect within the trench 115 or the field shield 107 itself.

Figure 8B:
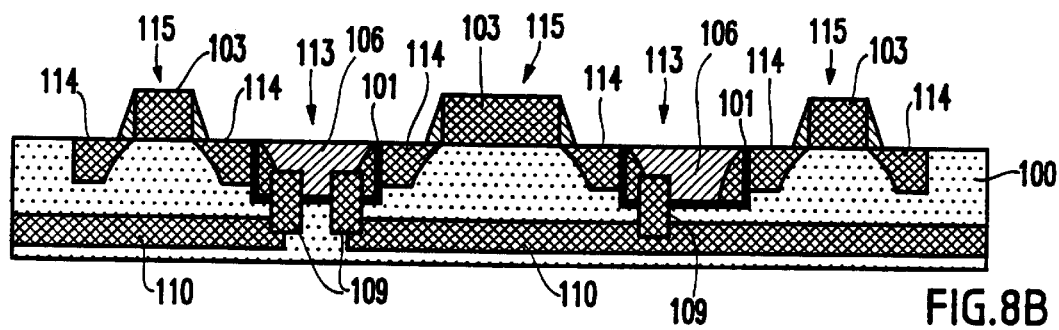
Figure 8C:
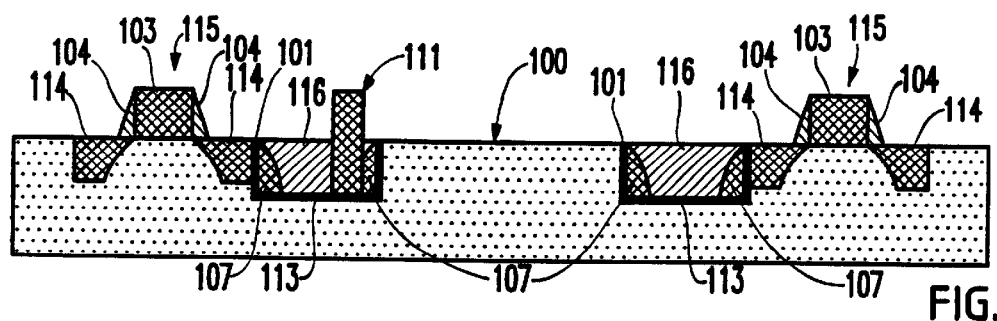
Figure 8D:
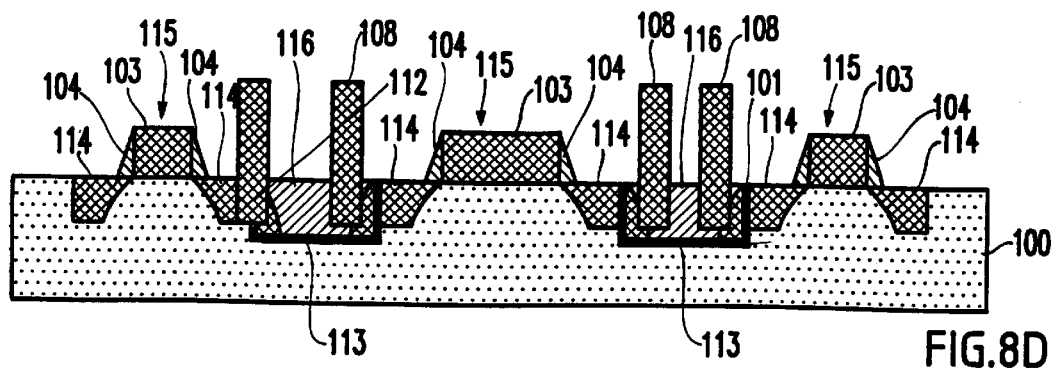

The inventive structure further includes contacts connected to the conductive field shields 107. The contacts may be in different forms. A surface contact 108 may be placed above the substrate 100 or a lower contact 109 may be placed below the substrate 100 as depicted in FIGS. 8a and 8b, respectively. Depending upon the structure of a trench 113, the field shields 107 may or may not come into contact with each other. If the field shields do contact each other then a central contact 111 may be located in the trench 113 as shown in FIG. 8c. When the trench 113 topography does not permit the field shields to contact each other, direct contacts 112 may be located on either side of the trench and be in direct contact with the field shield 107, as shown in FIG. 8d. Although they are not shown, either the direct contact 112 or the central contact 111 may be located above or below the surface of the substrate 100.

Figure 7:
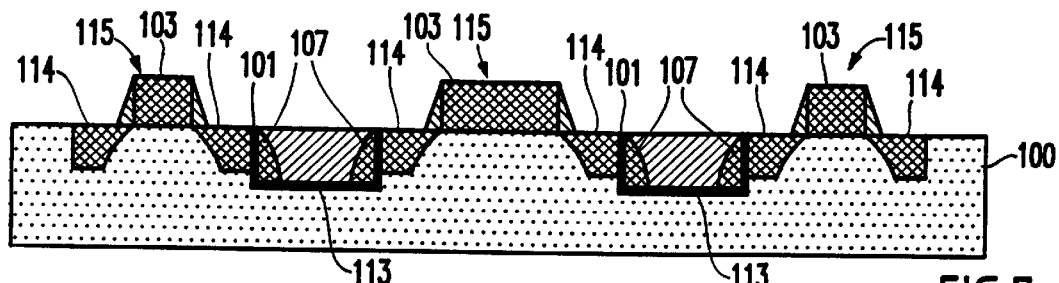
FIG. 7 is a schematic diagram depicting devices on the invention.

The contacts 108, 109, 111 and 112 provide independent electrical connections from ground or other potential to each of the field shields 107, which are electrically capacitively coupled to devices (e.g., transistors) 115 on the substrate 100. As in passive STI each device has a device gate 103, a device gate sidewall dielectric 104, and source/drain diffusions 114, as shown in FIG. 7. The independent connections between the ground or potential and the respective field shields 107 and devices are such that one field shield may be connected to one potential or ground and another field shield can be connected to another potential or ground. Each field shield 107 is then independently electrically capacitively coupled (e.g., through STI liner 101) to each device 115. The independent connection of each potential or ground to the field shield 107 and the device 115 allows a different potential to be placed on each field shield 107 and associated device 115 and, thus the independent biasing of the device 115 is accomplished.

Figure 1A:
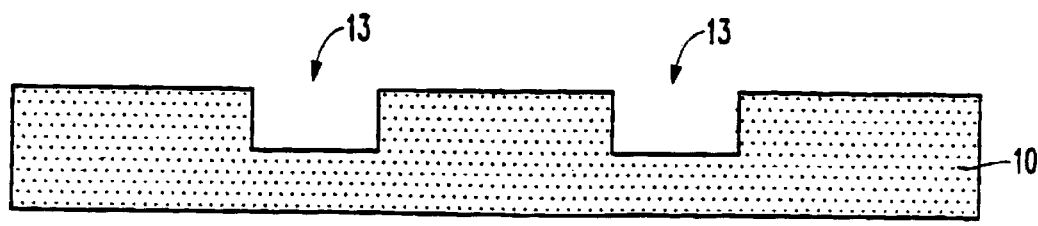
FIGS. 1a–1d are schematic diagrams depicting passive STI.
Figure 1B:
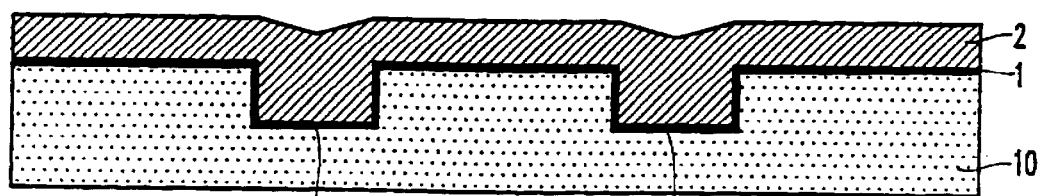
Figure 1C:
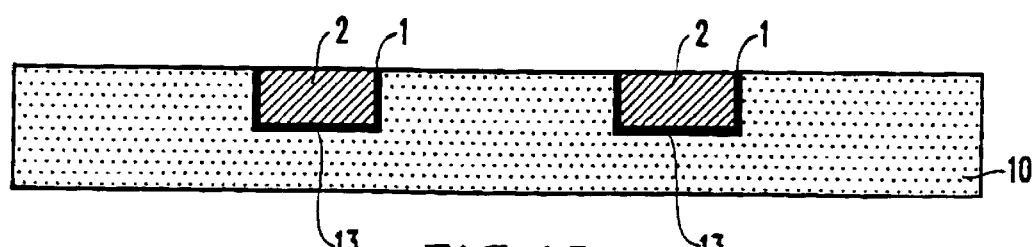
Figure 1D:
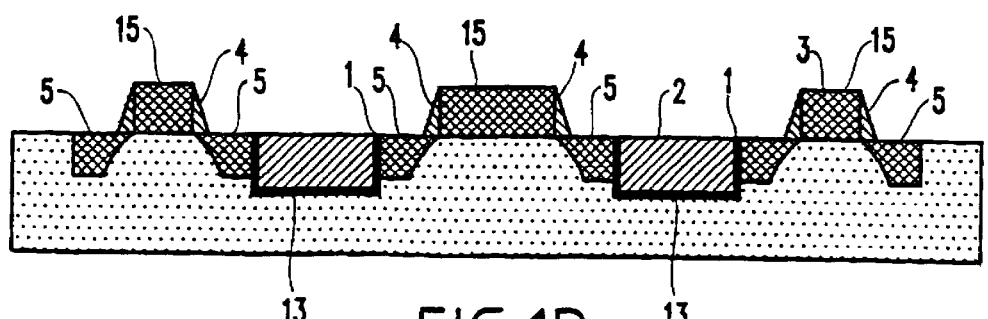
Figure 2:
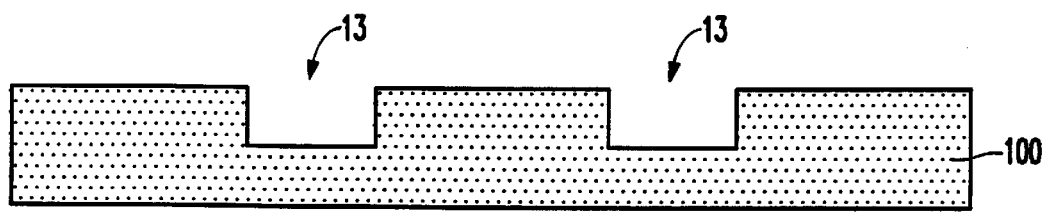
FIG. 2 is a schematic diagram depicting shallow trenches in a semiconductor substrate.
Figure 3:
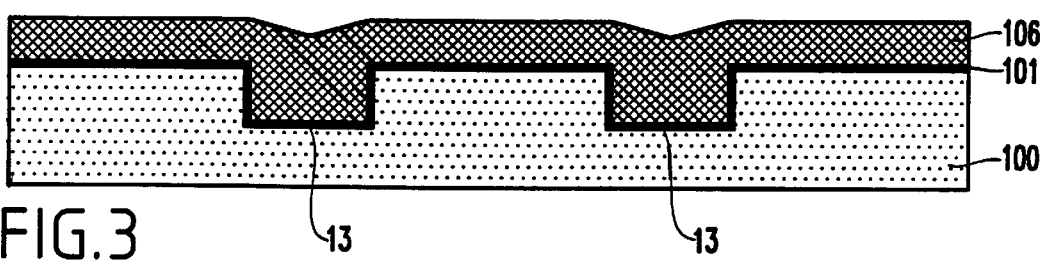
FIG. 3 is a schematic diagram depicting STI liner and conductor fill.
Figure 4:
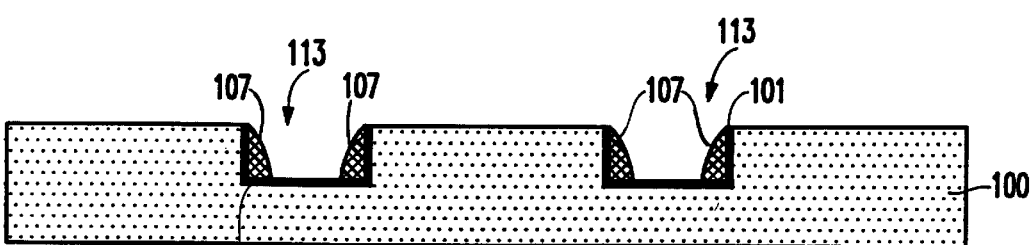
FIG. 4 is a schematic diagram depicting field shield formation.
Figure 5:
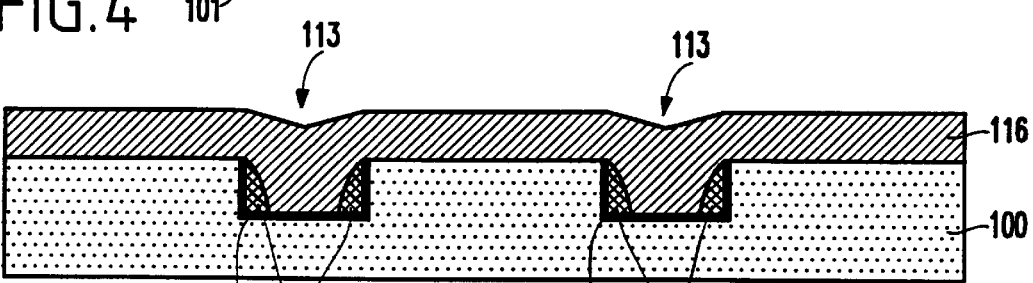
FIG. 5 is a schematic diagram depicting STI fill.
Figure 6:
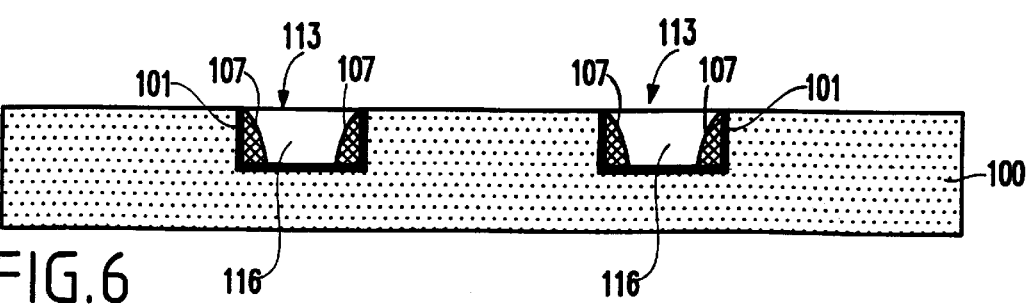
FIG. 6 is a schematic diagram depicting planarization of the invention.

The invention can be manufactured using any of several processes, as would be known to one ordinarily skilled in the art. For example, as shown in FIG. 2, just as in passive STI as discussed above, trenches 115 are etched into a substrate 100 (e.g. silicon) and the trenches 113 are filled with a laminate of insulating STI liner 101. However, the invention now diverges from passive STI and conductor fill 106 rather than an insulator fill 102 is deposited over the STI liner 101 and over the trenches 115. The conductor 106 may be any conventional material such as doped polysilicon, tungsten silicide or titanium silicide or other material well known to those skilled in the art. The conductor 106 is then etched such that conductor 106 remains on either side of the trench 115 and is contiguous with the sidewalls of the trenches 115. The remaining conductor 106 forms the conductive field shields 107 (e.g., sidewall spacers). Now, an insulator STI fill (e.g., an oxide) 116 is deposited in the trench such that the STI fill 116 covers the field shields 107, trenches 115 and substrate 100.

Next, chemical mechanical polishing (CMP) or another removal process well known to those skilled in the art is used to planarize the top surface of the device. The portion of the STI fill 116 located above the trenches 113 is similarly removed.

Figures 9A, 9B:
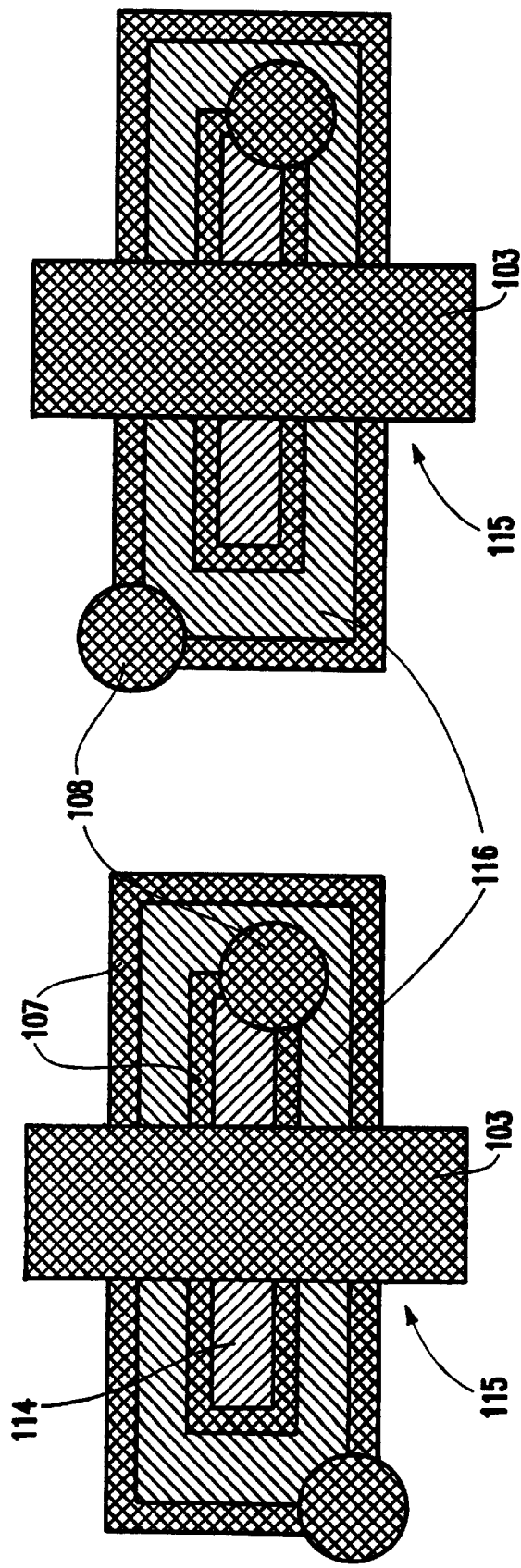

As shown in FIGS. 9a and 9b, devices 115 are built on the surface of the substrate 100 and contacts 108 are deposited in the trenches 113 in the positions as described above and such that the contacts 108 allow the independent biasing of the active devices. The contacts may be formed in various configurations as will be obvious to one of ordinary skill in the art based on this disclosure. For example, the contacts may be located on either side of the trench 113, contact each field shield 107 and extend above the surface of the substrate 100. The contacts may also extend beneath the trench and provide electrical connections between the field shields and the devices 110 beneath the surface of the substrate 100. The contacts may also be equidistant from the field shields 107 or in contact with the field shield 107 and device 115.

It should be noted that the shorting of the field shield contact 108 to the active silicon area may be avoided by several techniques, including formation of bottom contact, relaxing the STI round rules, or keeping the pad nitride in place over the active area 114 until the contact is fabricated.

This invention provides several advantages over the prior art and specifically over conventional passive STI. First, unlike passive STI, the invention allows independent voltage control in areas of the substrate which produces several advantages. The devices on the surface of the substrate may receive different voltages and thus may be independently biased. For example, a voltage, V1 may be applied to a first field shield 107 which is connected to a first device 115 and a voltage, V2, may be applied to a second field shield 107 and a second device 115. The lack of the field shield 107 in passive STI did not permit this biasing.

The independent biasing also reduces the sub-Vt leakage of the devices connected to data storage capacitors. The field shields 107 permit a voltage, Va, to be applied selectively only to the field shields adjacent transistor that require threshold voltage tailoring. When Va is applied to the field shield adjacent transistor, the threshold voltage of that transistor is made suitable for the particular application. For example, the Vt is raised and the leakage from the capacitor is reduced when sufficiently negative voltage is applied to the field shield adjacent a NMOSFET.

In addition, the field shield 107 may bias the devices 115 independently of the well doping. As the minimum feature size, F, of DRAM array MOSFETs is scaled down an increasingly higher channel doping concentration is required to obtain a threshold voltage which assures that the off-current objective (typically 1fA/device) is met. However, it has been experimentally determined that peak channel doping concentrations in excess of approximately $6.0 \times 10^{17}$ cm$^{-3}$ results in a marked degradation of the retention time tail, due to a defect driven junction leakage mechanism. Thus, it is desirable to avoid the use of peak channel doping concentration in excess of $6.0 \times 10^{17}$ cm$^{-3}$. With conventional STI there is no way to avoid such high channel doping concentrations while still utilizing zero volts for the word-line low-level. With the active isolation taught in this invention, the field shield adjacent selected devices (i.e. array MOSFETs) may be biased at a sufficiently negative potential such that the threshold voltage is increased and that the off-current is decreased to desired levels, without exceeding the maximum allowed channel doping concentration. As the conductive field shield spacer adjacent an NMOSFET (formed in a P-well) is biased increasingly more negative, the majority carrier concentration (holes in a P-well) in the well of the MOSFET increases. For determining the threshold voltage of the MOSFET, the increase in majority carrier concentration is electrically equivalent to increased channel doping concentration. However, the increased majority carrier concentration does not result in increased defect generated junction leakage, since the actual well doping is not increased.

The invention is very versatile, and although not specifically shown, works with vertical devices, P-FETs, and N-FETs. In addition, as discussed above, the invention may have various contact structures. The field shields 107 may also be made of many different materials.

The invention allows parasitic control without high doping. One of the problems encountered with STI is parasitic MOSFET conduction at the silicon corner adjacent the STI (see "The Current-Carrying Corner Inherent to Trench Isolation," A. Bryant, et al, IEEE Electron Device Letters, Vol. 14, No. 8, August 1993, pp. 412–441, incorporated herein by reference.) The proximity of the gate conductor to the silicon corner of small radius of curvature (e.g., 5–20 mn) results in enhancement of the gate electric field at the corner and lowering of the corner threshold voltage relative to the threshold voltage away from the corner. This corner conduction effect is equivalent to a low Vt MOSFET which is in parallel with the MOSFET having the desired Vt. The isolation taught here may be used to reduce the corner conduction effect. By selectively biasing the conductive spacer field-shield adjacent to the channel edge of a MOSFET having a parasitic corner conduction concern sufficiently negative, the Vt of the parasitic MOSFET may be increased above the Vt elsewhere in the device. This application of the conductive spacer field-shield isolation is particularly useful for MOSFETs having channel widths greater than 0.5 μm. For these relatively wide MOSFETs, the corner Vt is essentially decoupled from the Vt elsewhere in the channel, thereby allowing the corner Vt to be raised without significantly affecting the Vt for the remainder of the device. For this application minimal recess of the top of the conductive spacer below the top surface of the silicon substrate is preferred.

The field shields 107 may be used as a local interconnect within the trench 115 or the field shield 107 itself. The conductive spacer on the sidewall of the shallow trench provides an additional wiring level, which may be used to connect a plurality of relatively closely spaced structures to one another. For example, contact to a portion of the conductive spacer can be made to a plurality of locations on the spacer. In turn, each of the contacts may also be wired to other structures. These contacts may be connected to diffusions, to portions of the wells in the semiconductor substrate in which the MOSFETs are formed, to gate conductors, or to higher levels of metallization.

The split electrode formation of the field shields 107 reduces device shorting as compared to a fully metal filled field shield. In addition, the problem of gap fill is reduced, the conductive materials used as the field shields contain metals and are much more conformed than other materials which conventional processed place in the trenches. As a result, the gaps in the silicon substrate created by the trench etching are more easily filled.

While the invention has been described in terms of preferred embodiments, those skilled in the art will recognize that the invention can be practiced with modification within the spirit and scope of the appended claims.

What is claimed is:

1. A semiconductor device comprising:

a substrate comprising trenches;

a plurality of devices on said substrate isolated by said trenches;

an insulating liner on surfaces of said trenches;

conductive sidewall spacers within said trenches;

an insulator filling said trenches between said conductive sidewall spacers;

a first contact electrically connected to a first conductive sidewall spacer; and a second contact electrically connected to a second conductive sidewall spacer, wherein one or more of said plurality of devices is independently biased by applying different voltages to said first conductive sidewall spacer and said second conductive sidewall spacer.

2. The semiconductor device of claim 1, further comprising:

a contact above a surface of said substrate and electrically connected to one of said conductive sidewall spacers; and a voltage source electrically connected to said contact, wherein said source can independently bias one of said plurality of devices.

3. The semiconductor device of claim 1, wherein said insulator separates said conductive sidewall spacers.

4. The semiconductor device of claim 1, wherein said conductive sidewall spacers comprise field shields.

5. The semiconductor device of claim 1, wherein said conductive sidewall spacers are beneath a top surface of said substrate.

6. The semiconductor device of claim 1, further comprising a first contact contiguous with one of said conductive sidewall spacers.

7. A semiconductor device comprising:

a substrate comprising trenches;

a plurality of devices on said substrate isolated by said trenches;

an insulating liner on surfaces of said trenches;

conductive sidewall spacers; and an insulator filling said trenches between said conductive sidewall spacers, wherein a first conductive sidewall spacer is electrically connected to a first device of said plurality of devices and a second conductive sidewall spacer is electrically connected to a second device of said plurality of devices and said first device is biased independently of said second device.

8. The semiconductor device according claim 7, further comprising a first contact extending above a surface of said substrate.

9. The semiconductor device according claim 8, wherein said first contact abuts a first device of said plurality of devices and said first conductive sidewall spacer.

10. The semiconductor device of claim 7, wherein said insulator separates said conductive sidewall spacers.

11. The semiconductor device of claim 7, wherein said conductive sidewall spacers comprise field shields.

12. The semiconductor device of claim 7, wherein said conductive sidewall spacers are beneath a top surface of said substrate.

13. The semiconductor device of claim 7, further comprising a first contact contiguous with one of said conductive sidewall spacers.

* * * * *